US007947243B2

(12) United States Patent
Komatsu et al.

(10) Patent No.: US 7,947,243 B2
(45) Date of Patent: May 24, 2011

(54) BORON NITRIDE THIN-FILM EMITTER AND PRODUCTION METHOD THEREOF, AND ELECTRON EMITTING METHOD USING BORON NITRIDE THIN-FILM EMITTER

(75) Inventors: Shojiro Komatsu, Tsukuba (JP); Yusuke Moriyoshi, Tsukuba (JP); Katsuyuki Okada, Tsukuba (JP)

(73) Assignee: National Institute for Materials Science, Tsukuba-Shi, Ibaraki (JP)

( * ) Notice: Subject to any disclaimer, the term of this patent is extended or adjusted under 35 U.S.C. 154(b) by 909 days.

(21) Appl. No.: 11/665,250

(22) PCT Filed: Dec. 21, 2005

(86) PCT No.: PCT/JP2005/023995

§ 371 (c)(1), (2), (4) Date: Apr. 12, 2007

(87) PCT Pub. No.: WO2006/068287

PCT Pub. Date: Jun. 29, 2006

(65) Prior Publication Data

US 2008/0030152 A1 Feb. 7, 2008

(30) Foreign Application Priority Data

Dec. 22, 2004 (JP) ................................ 2004-371693

(51) Int. Cl.

| | |
|---|---|
| ***C01B 35/00*** | (2006.01) |
| ***C01B 21/064*** | (2006.01) |
| ***C01B 25/00*** | (2006.01) |
| ***C01D 3/02*** | (2006.01) |
| ***H01J 11/04*** | (2006.01) |
| ***C23C 14/28*** | (2006.01) |
| ***C23C 16/00*** | (2006.01) |
| ***B05D 3/02*** | (2006.01) |
| ***B05D 3/00*** | (2006.01) |
| ***H05H 1/24*** | (2006.01) |
| ***B01J 19/12*** | (2006.01) |
| ***H01L 21/4763*** | (2006.01) |

(52) U.S. Cl. ........ 423/290; 423/276; 423/490; 315/326; 427/595; 427/314; 427/255.23; 427/569; 427/589; 204/157.41; 204/157.45; 438/634

(58) Field of Classification Search ........................ None
See application file for complete search history.

(56) References Cited

U.S. PATENT DOCUMENTS 5,228,044 A * 7/1993 Ohba ........................ 372/45.01
5,286,533 A * 2/1994 Komatsu et al. .............. 427/554

FOREIGN PATENT DOCUMENTS

JP H06-316402 11/1994
JP H11-273551 10/1999
JP 2001-181706 7/2001

* cited by examiner

*Primary Examiner* — Melvin C Mayes
*Assistant Examiner* — Guinever S Gregorio
(74) *Attorney, Agent, or Firm* — Manabu Kanesaka

(57) ABSTRACT

Based on designs concerning boron nitride thin-films each including boron nitride crystals in acute-ended shapes excellent in field electron emission properties, and designs of emitters adopting such thin-films, it is aimed at appropriately controlling a distribution state of such crystals to thereby provide an emitter having an excellent efficiency and thus requiring only a lower threshold electric field for electron emission.

In a design of a boron nitride thin-film emitter comprising crystals that are each represented by a general formula BN, that each include $sp^3$ bonded boron nitride, $sp^2$ bonded boron nitride, or a mixture thereof, and that each exhibit an acute-ended shape excellent in field electron emission property; there is controlled an angle of a substrate relative to a reaction gas flow upon deposition of the emitter from a vapor phase, thereby controlling a distribution state of the crystals over a surface of the thin-film.

12 Claims, 7 Drawing Sheets

BORON NITRIDE THIN-FILM EMITTER AND PRODUCTION METHOD THEREOF, AND ELECTRON EMITTING METHOD USING BORON NITRIDE THIN-FILM EMITTER

TECHNICAL FIELD

The present invention relates to a boron nitride thin-film emitter having an excellent electron emission property, comprising crystals that are each represented by a general formula BN, that each include $sp^3$ bonded boron nitride, $sp^2$ bonded boron nitride, or a mixture thereof, and that each exhibit an acute-ended shape excellent in field electron emission property, wherein the crystals are aggregated and distributed to exhibit a two-dimensional self-similar fractal pattern.

More particularly, the present invention relates to a boron nitride thin-film emitter and a production method thereof, where the emitter is utilizable as an electron source in a lamp type light source device, a field emission type display, and the like each adopting a field emission type electron source.

BACKGROUND ART

In the technical field of electron emitting material, various ones have been proposed. The tendency thereof is to demand such materials each having a higher voltage endurance and a larger electric-current density. Examples thereof include carbon nanotubes having been recently noticed, and it is required to make an endeavor to enhance an electron emission property and to increase an electric-current density for designs of electron emitting materials based on carbon nanotubes. It has been thus attempted to treat carbon nanotubes in such a manner to grow thin-films thereof in a patterned form, or to form carbon nanotubes into shapes suitable for electron emission by utilizing a print transcription technique.

However, carbon nanotubes have not been well established in production methods themselves, and still less, investigations of processing techniques therefor have been just started, thereby exhibiting an extremely difficult situation for the production methods. Further, even by conducting such laborious and difficult processing, the obtained performance is merely limited to an electric-current density in an order of several $mA/cm^2$ at a maximum.

This leads to a limitation of usable electric field strength of an applicable material, and exceeding the limitation causes degradation and peeling off of the material, thereby causing the material to fail to withstand usage at a higher voltage and over a long time. On the other hand, such field electron emission techniques are expected to be made more active from now on, and there have been thus sought for materials each having a higher withstand electric field strength, being capable of stably emitting electrons at a larger electric-current density for a long time usage, and enabling stable and higher field electron emission, without degradation and damage of each material.

The present inventors have conducted investigations, in order to satisfy the demands. Namely, the present inventors have noticed boron nitride having been used as heat-resistant and wear-resistant materials and recently noticed as novel creative ones, have earnestly conducted investigations so as to design electron emitting materials based on such boron nitride materials, and finally have found out that those of boron nitride materials which are fabricated under specific conditions include ones each having an excellent field electron emission property and exhibiting an acute-ended shape, with a higher withstand electric field strength.

Namely, the present inventors have confirmed and appreciated: that, in case of generation and deposition of boron nitride onto a substrate by a reaction from a vapor phase, irradiation of ultraviolet light having higher energies toward the substrate leads to formation of boron nitride in a film shape and leads to generation and growth of $sp^3$ bonded boron nitride crystals exhibiting acute-ended shapes on the film surface, where the boron nitride crystals grow in a self-organizing manner toward the light direction at appropriate intervals; and that the thus obtained film easily emits electrons upon application of electric field thereto, and the film acts as an extremely excellent electron emitting material capable of maintaining an extremely stable state and performance without degradation, damage, and dropout of material while maintaining a higher electric-current density which may be unprecedented over these kinds of materials up to now; so that the present inventors have filed patent applications (see Patent Documents 1 and 2) as a result thereof.

Patent Document 1: Japanese Patent Application Laid-Open Publication No. 2004-35301

Patent Document 2: Japanese Patent Application No. 2003-209489

Thereafter, the present inventors have further conducted investigations based on the inventions according to the previous patent applications, and have succeeded in developing a cold cathode type emitter having an excellent electron emission property and capable of emitting electrons even in the atmospheric air, and a light emission/display device utilizing the emitter, so that the present inventors also have recently filed patent applications (see Patent Documents 3 and 4) as a result thereof.

Patent Document 3: Japanese Patent Application No. 2004-361146

Patent Document 4: Japanese Patent Application No. 2004-361150

The inventions according to the previous patent applications noted just above relate to elements for emitting electrons and utilization thereof, and have focused on provision of an $sp^3$ bonded boron nitride crystal in an acute-ended shape contributing to an electron emission property with reproducibility, so that importance has been exclusively given to an optimum reaction condition and an optimum region setting for such provision. However, it has gradually become apparent: that excellent electron emission properties are not sufficiently attained only by simple provision of specific shapes in design of emitter; and that extreme importance is to be given to an in-plane distribution density of acute-ended crystals. Namely, it has become apparent that excessively higher or excessively lower crystal distribution densities rather lead to deteriorated electron emission properties, respectively. Excessively higher densities problematically cause electric fields to fail to sufficiently permeate into the vicinity of crystals which are to emit electrons such that sufficient enhancement of electric fields are not realized near the acute ends, thereby leading to higher threshold electric fields for electron emission. Contrary, it has gradually become apparent that excessively lower densities problematically fail to allow larger electric currents themselves.

DISCLOSURE OF THE INVENTION

Problem to be Solved by the Invention

Accordingly, based on the designs of the previous inventions by the present inventors concerning boron nitride thin-films each including boron nitride crystals in acute-ended shapes excellent in field electron emission properties, and based on the designs of emitters adopting such thin-films, the present invention aims at appropriately controlling a distribution state of such crystals to thereby provide an emitter having an excellent efficiency and thus requiring only a lower threshold electric field for electron emission.

Means for Solving the Problem

To this end, the present inventors have earnestly conducted investigations and found: that a distribution state of boron nitride crystals deposited on a substrate is largely altered, as a mounting angle of the substrate relative to a reaction mixture gas flow is changed from a configuration where the substrate and the reaction mixture gas flow are mutually in parallel to a configuration where the reaction mixture gas impinges on the substrate with intersection; and that, while differences are caused in in-plane distribution density of the number of boron nitride crystals each having an acute-ended shape when the substrate is set not in parallel with the gas flow, such differences are not necessarily related to evaluation of electron emission properties, thereby bringing about a limit for lowering a threshold for electron emission.

The present inventors also have found: that, when the substrate is set in parallel with the gas flow, a boron nitride film is deposited by irradiating high-energy ultraviolet laser light to the substrate; that a self-similar fractal pattern two-dimensionally appears on a surface of the thus deposited boron nitride film; and that, when the boron nitride film having the fractal pattern is evaluated as an emitter, there can be expressed an excellent performance having a lower threshold for electron emission as compared with a situation where the substrate is intersected with the gas flow. The present invention has been carried out based on the above knowledge, and the configurations thereof are recited in the following items (1) through (10).

(1) A boron nitride thin-film emitter having an excellent electron emission property, comprising crystals that are each represented by a general formula BN, that each include $sp^3$ bonded boron nitride, $sp^2$ bonded boron nitride, or a mixture thereof, and that each exhibit an acute-ended shape excellent in field electron emission property, wherein the crystals are aggregated and distributed to exhibit a two-dimensional self-similar fractal pattern.

(2) The boron nitride thin-film emitter having an excellent electron emission property of item (1), wherein the boron nitride thin-film emitter having a excellent electron emission property and including the crystals aggregated and distributed to exhibit the two-dimensional self-similar fractal pattern, is established in self-forming on an emitter element substrate by a reaction from a vapor phase.

(3) The boron nitride thin-film emitter having an excellent electron emission property of item (2), wherein the boron nitride thin-film emitter having a excellent electron emission property and including the crystals aggregated and distributed to exhibit the two-dimensional self-similar fractal pattern obtained by the reaction from the vapor phase, is obtained by adjusting the emitter element substrate and a reaction mixture gas flow into a mutually parallel relationship.

(4) The boron nitride thin-film emitter of any one of items (1) to (3), wherein the boron nitride thin-film emitter having a excellent electron emission property is an emitter to be used in a light emitting display device.

(5) The boron nitride thin-film emitter of any one of items (1) to (3), wherein the boron nitride thin-film emitter having a excellent electron emission property is an emitter to be used in a lighting device.

(6) A production method of a boron nitride thin-film emitter comprising crystals that are each represented by a general formula BN, that each include $sp^3$ bonded boron nitride, $sp^2$ bonded boron nitride, or a mixture thereof, and that each exhibit an acute-ended shape excellent in field electron emission property, the method comprising the steps of:

preparing an ambient gas including: a dilution gas solely comprising a rare gas such as argon or helium, or hydrogen, or a mixture gas thereof; and 0.0001 to 100 vol % of a source gas of boron source and nitrogen source introduced into the dilution gas;

flowing the ambient gas onto a substrate held at a room temperature to a temperature of 1,300° C., under a pressure of 0.001 to 760 Torr; and irradiating ultraviolet light onto the substrate, with or without generating plasma;

wherein the method further comprises the step of:

adjusting an angle defined between the substrate and the ambient gas flow including the reaction mixture gas to control a distribution pattern and a distribution density of the crystals that are formed at a surface of a film produced on the substrate and that each have the acute-ended shape excellent in field electron emission property.

(7) The production method of a boron nitride thin-film emitter of item (6), wherein the adjusting step comprises:

adjusting the angle defined between the substrate and the ambient gas flow including the reaction mixture gas so that the substrate and the ambient gas flow are in parallel to form, on the surface of the film produced on the substrate, a two-dimensional self-similar fractal pattern by the crystals each having the acute-ended shape excellent in field electron emission property, to thereby obtain the boron nitride thin-film emitter having a lower threshold for electron emission.

(8) The production method of a boron nitride thin-film emitter of item (6) or (7), wherein the method further comprises the step of:

controlling the temperature of the substrate and the rate of the ambient gas flow including the reaction mixture gas.

(9) An electron emitting method, comprising the step of:

upon applying a voltage to the boron nitride thin-film emitter of any one of items (1) to (5) to cause the boron nitride thin-film emitter to emit electrons, contacting the boron nitride thin-film emitter with an ambient gas including a polar gas, thereby improving an electron emission property of the boron nitride thin-film emitter.

(10) The electron emitting method of item (9), wherein the polar gas is water and/or alcohol.

Effect of the Invention

Although it has been conventionally indispensable, for extraction of electrons from a substance, to apply a higher voltage to a substance in vacuum in case of a cold cathode type, or to conduct high-temperature heating of a substance at 2,000° C. or higher in case of a thermoelectron type, and it has been exemplarily required to encapsulate an apparatus or device in vacuum in case of equipments utilizing electrons extracted into a space, so that electron emission has anyway required specific and expensive equipment configurations; the present invention has succeeded in providing a thin-film emitter excellent in field electron emission property, comprising crystals that are each represented by BN, that include $sp^3$ bonded boron nitride, $sp^2$ bonded boron nitride, or a mixture thereof, and that each exhibit an acute-ended shape, by irradiating ultraviolet light onto a substrate constituting an electronic component, in a manner that the thin-film emitter is produced to have a surface established in self-forming with a two-dimensional self-similar fractal pattern of the crystals, thereby allowing the thin-film emitter to have a lower threshold for electron emission and to exhibit a stable behavior for electron emission even in an "as-grown" state of the thin-film emitter.

EXPLANATION OF REFERENCE NUMERALS

Figure 1:
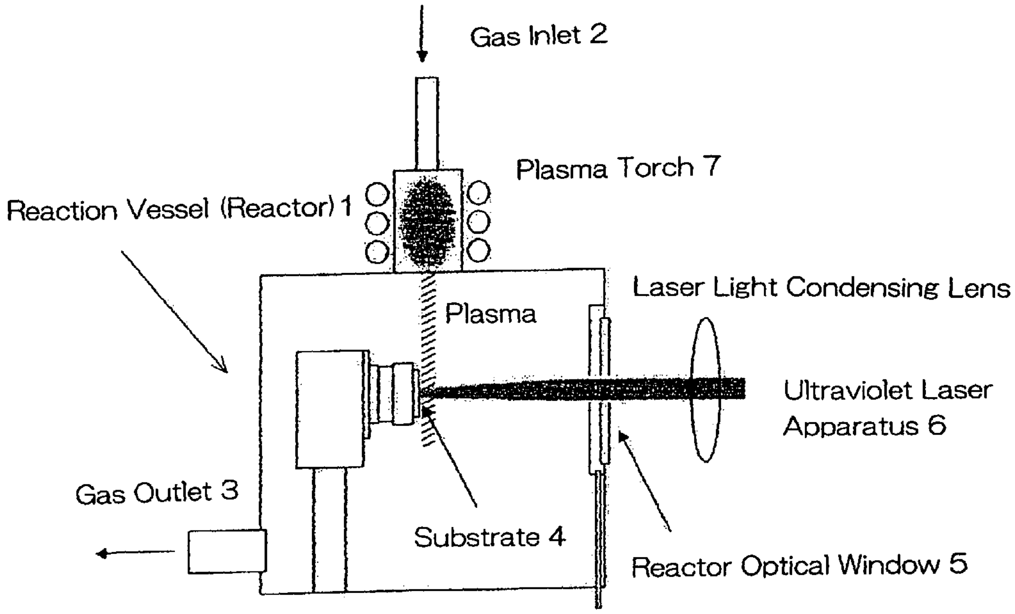
FIG. 1 is a schematic view of a reaction apparatus used for synthesis of a BN emitter having a fractal distribution according to an Example 1.

1 reaction vessel (reactor)
2 gas inlet
3 gas outlet
4 boron nitride deposition substrate
5 optical window
6 excimer ultraviolet laser apparatus
7 plasma torch

BEST MODE FOR CARRYING OUT THE INVENTION

In the present invention, it is required to irradiate ultraviolet light upon reaction from vapor phase, for self-forming establishment of acute-ended surface textures excellent in field electron emission property. This has been already clarified in the previous patent applications based on the inventions of the present inventors. Although the reason thereof has been referred to in the previous patent applications, the following consideration may be provided. Namely, according to indication by Ilya Prigogine (a Novel prize winner) et al., self-organizing formation of surface configuration is understood as a "turing structure" that appears under a certain condition where a surface diffusion of a precursor substance and a surface chemical reaction thereof compete with each other. Here, it is considered that ultraviolet irradiation is involved in photochemical promotion of both the diffusion and reaction, in a manner to affect on a regular distribution of initial nuclei. The growth reaction at the surface is promoted by ultraviolet irradiation, thereby meaning that the reaction rate is proportional to a light intensity. Assuming that initial nuclei are hemispherical, growth is promoted near apexes thereof by virtue of higher light intensities, but growth is delayed at peripheries of the nuclei due to weakened light intensities. This is considered to be one of factors for establishment of acute-ended surface texture formation. Anyway, ultraviolet irradiation plays an extremely important role, and this is an undeniably important point.

While importance is to be given to shapes of boron nitride crystals to be produced by reaction from vapor phase for lowered threshold electric fields for electron emission in the boron nitride thin-film emitter according to the present invention as already explained in the previous patent applications, it has progressively become apparent that the distribution density of crystals is important for an actual design of emitter such that excessively higher or lower densities lead to difficulty in achievement of stabilized operation as an emitter. Namely, it is required to suitably control a distribution state of crystals for designing a reliable emitter. In the present invention, the two-dimensional self-similar fractal pattern formed on a surface of boron nitride film has a significance to remarkably contribute to a stabilized operation as an emitter, to thereby solve the above-described problems.

Although the reason of formation of such a two-dimensional self-similar fractal pattern is not exactly apparent at the present stage, the consideration for them based on the current level of non-linear science is as follows. Namely, it is known that steady establishment of configuration as a "turing structure" (also called "dissipative structure") is conducted by provision of an extremely non-equilibrium condition, in a process accompanied by competition between a surface diffusion of a precursor substance (such as radical) and a surface growth reaction thereof. Also in the process of the present invention, the above-described condition is met by realization of a non-equilibrium state exhibiting a larger difference between a surface radical concentration and a spatial radical concentration just after occurrence of an extremely rapid growth reaction by virtue of periodical laser pulse light, so that the fractal pattern is formed as a kind of dissipative structure.

What can be said at the present stage is described above, and anyway, the significance of formation of two-dimensional self-similar fractal pattern can be appreciated in that the pattern causes an emitter to have an improved function and to operate stably. The present inventors have found that the means for creating such a pattern can be readily prepared by adjusting a relationship between a substrate for forming a film thereon and a gas flow, and concretely, by selecting whether a reaction gas is to be flowed to the substrate with intersection or in parallel with the substrate without intersection. This can also be confirmed from a fact that a remarkable difference is caused by adjusting a setting angle of a substrate relative to a reaction gas flow, as exemplified by Example 1 and Comparative Example 1 to be described later.

The present invention will be described hereinafter based on the accompanying drawings and embodiments.

To obtain $sp^3$ bonded boron nitride of the present invention which is excellent in field electron emission property or a mixture thereof with $sp^2$ bonded boron nitride, it is possible to use a CVD reaction vessel having a structure shown in FIG. 1. In FIG. 1, the reaction vessel 1 is provided with a gas inlet 2 for introducing a reaction gas and a dilution gas therefor, and an exhaust system (gas outlet) 3, and is connected to a vacuum pump so that the vessel is pressure reduced to and held at a pressure lower than the atmospheric pressure. Set at a flow passage of the gas within the vessel is a boron nitride deposition substrate 4, and the reaction vessel includes a wall having an optical window 5 attached to a part of the wall facing toward the substrate, while setting an excimer ultraviolet laser apparatus 6 so as to irradiate ultraviolet light onto the substrate through the window.

The reaction gas introduced into the reaction vessel is flowed in parallel with the substrate surface and excited at the substrate surface by ultraviolet light irradiated thereto, such that a nitrogen source and a boron source in the reaction gas are subjected to a vapor phase reaction and/or a surface reaction, thereby producing $sp^3$ bonded boron nitride or a mixture thereof with $sp^2$ bonded boron nitride represented by a general formula BN on the substrate constituting an electronic component, which boron nitride grows into a film shape. Although experiments have clarified that the pressure within the reaction vessel is then practicable over a wide range of 0.001 to 760 Torr. and that the temperature of the substrate set within the reaction space is practicable over a wide range of room temperature to 1,300° C., lower pressures and higher temperatures are to be desirably practiced for obtaining the intended reaction product at a high purity.

Note that the present invention also embraces such an embodiment that plasma is irradiated concurrently with irradiation of high-energy laser ultraviolet light for excitation onto a substrate surface or to a space near it. FIG. 1 shows a plasma torch 7 for such an embodiment, where the reaction gas inlet and the plasma torch are integrally set toward the substrate such that the reaction gas and plasma are irradiated to the substrate.

The invention of the present application is practiced by using the reaction vessel, and will be further explained hereinafter based on the accompanying drawings and concrete Examples. Note that the following Examples are disclosed to strictly aid in readily understanding the present invention, and the present invention is not limited thereto. Namely, the present invention has an object to provide a field electron emission element, a production method thereof, and an electron emitting method adopting the element, where the field electron emission element having a surface texture established in self-forming excellent in field electron emission property mainly includes $sp^3$ bonded boron nitride excellent in field electron emission property, or a mixture thereof with $sp^2$ bonded boron nitride; and the reaction conditions and the like can be of course modified and settled appropriately insofar as such an object can be attained.

The present invention will be concretely explained based on Examples. Note that these Examples are disclosed to readily understand the present invention, and the present invention is not intended to be limited thereto.

EXAMPLE 1

Within an ambient prepared by introducing diborane at a flow rate of 5 sccm and ammonia at a flow rate of 10 sccm into a dilution gas of argon at a flow rate of 3 SLM so that the ambient is concurrently exhausted by a pump to keep the ambient under a pressure of 10 Torr, excimer laser ultraviolet light was irradiated onto a disk-like nickel substrate having a diameter of 25 mm and kept at a temperature of 900° C. (see FIG. 1). At this time, the mixed gas was made into plasma in an inductively coupled manner by an electric field at 13.56 MHz as shown in this figure (although it has been found out that the same morphology is obtained to attain an excellent field electron emission property even when the mixed gas is not made into plasma, differences are then left in growth rate and the like). Synthesis time of 60 minutes gave an intended substance. This specimen was determined by X-ray diffraction to have a hexagonal crystal system exhibiting a 5H type polymorphic structure by $sp^3$ bond and having lattice constants of a=2.50 Å and c=10.40 Å.

Figure 2:
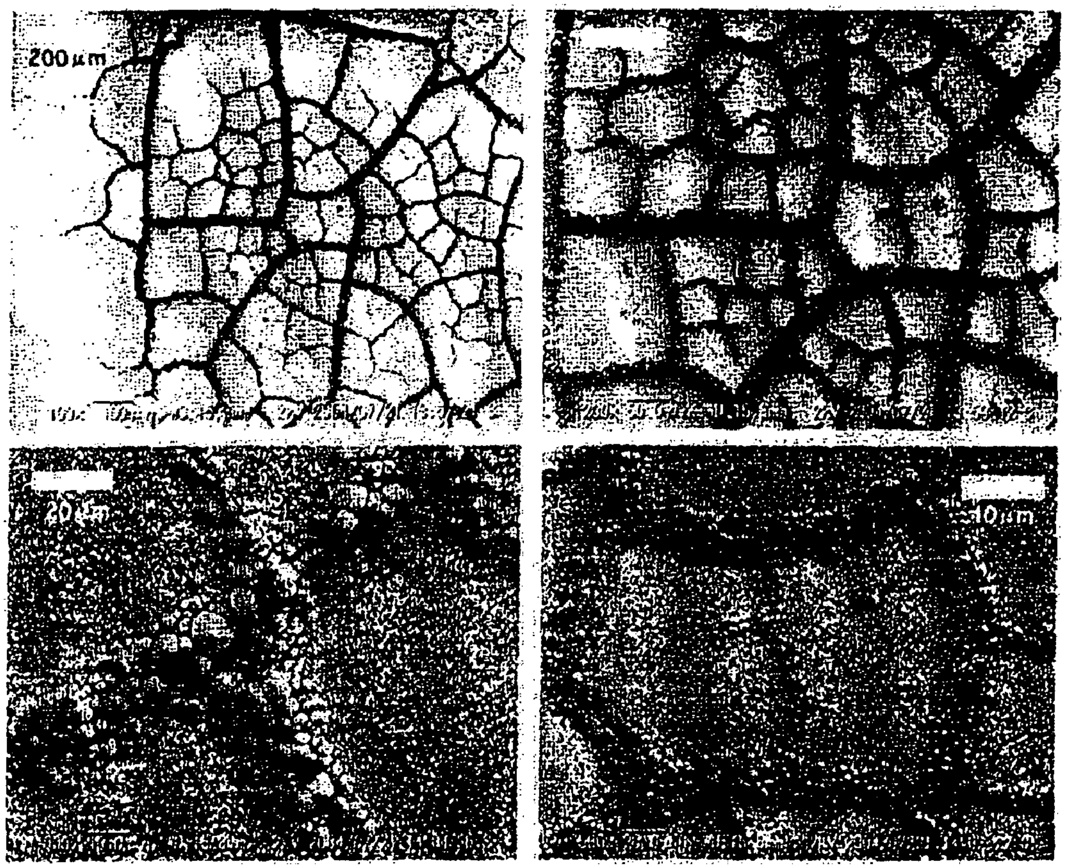
FIG. 2 is a photograph taken by a scanning electron microscope and showing the fractal distribution of the BN emitter obtained in Example 1.

Here, the substrate was installed in parallel with the plasma flow as shown in FIG. 1, so that diffusion was made dominant and rate-determining as compared with flow when reaction precursor substances such as radical reached the substrate. This allowed obtainment of an electron emissive BN emitter (fractal emitter) including crystals in acute-ended shapes collectively exhibiting a fractal (self-similar, (scale invariable) distribution pattern as shown in FIG. 2, unlike a uniformly distributed pattern.

COMPARATIVE EXAMPLE 1

Figure 3:
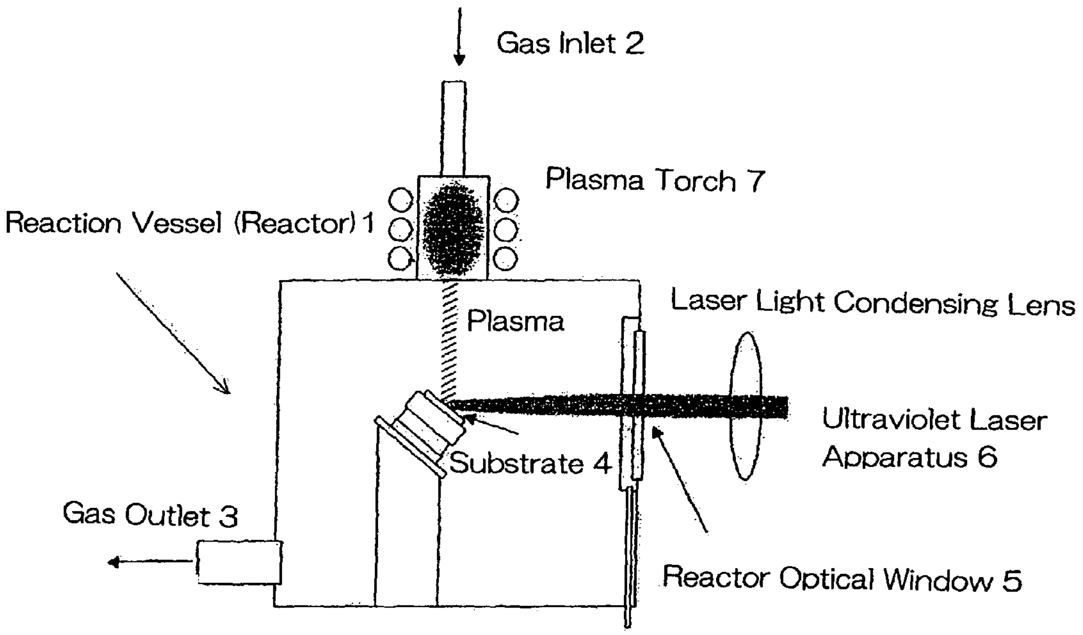
FIG. 3 is a schematic view of a reaction apparatus used for synthesis of a BN emitter having a uniform distribution obtained in Comparative Example 1.
Figure 4:
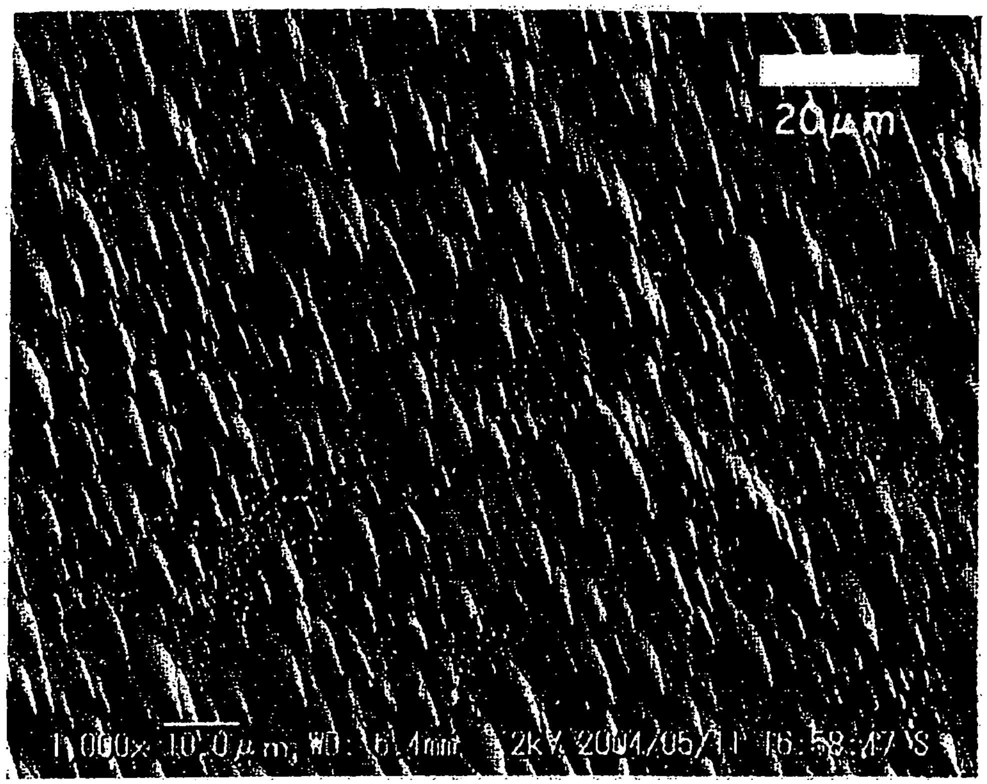
FIG. 4 is a photograph taken by a scanning electron microscope and showing the uniform distribution of the BN emitter obtained in Comparative Example 1.

Preparation was conducted in a state where a substrate was inclined by 45 degrees to both a plasma flow and laser light as shown in FIG. 3, and under the same synthesis conditions as Example 1. Flow was then made dominant over diffusion, thereby obtaining a conventional type (already filed as patent application) of emitter (uniform distribution emitter) including crystals in acute-ended shapes which were substantially uniformly grown and distributed as shown in FIG. 4.

EXAMPLE 2

Figure 5:
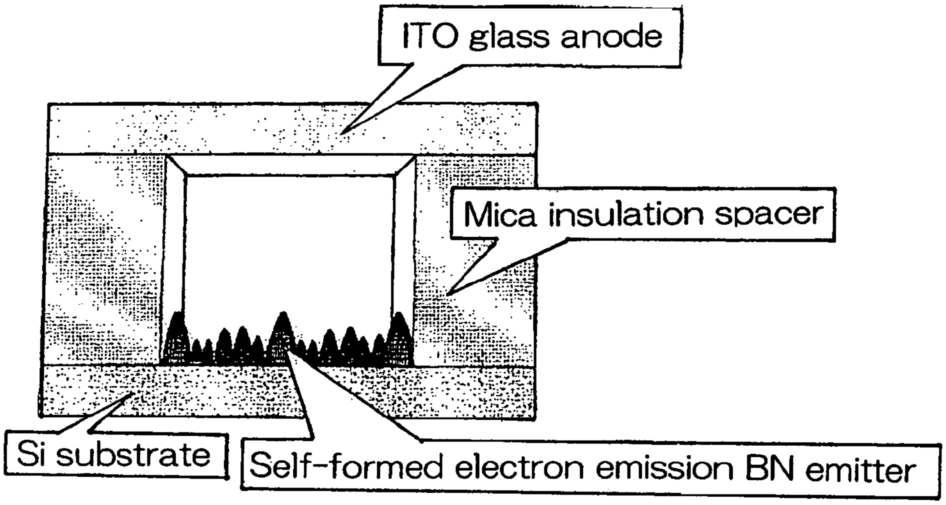
FIG. 5 is a schematic view of a measurement sample for Example 2 and Comparative Example 2.

As shown in FIG. 5, there were used the fractal emitter specimen obtained in Example 1, and a mica layer having a thickness of 50 μm as an inter-electrode gap forming insulation layer placed on the thin-film specimen, followed by placement of an ITO glass onto the mica layer such that an ITO surface was faced toward the specimen surface. The ITO surface acted as an anode and the specimen side acted as a cathode, while defining a gap of about 40 μm between the cathode surface and the ITO surface of anode, thereby establishing a sample for measurement of electron emission property of the emitter. Measurement method and measurement result thereof will be described in detail in Examples 3 and 4.

COMPARATIVE EXAMPLE 2

As shown in FIG. 5, there were used the uniform distribution emitter specimen obtained in Comparative Example 1, and a mica layer having a thickness of 50 μm as an inter-electrode gap forming insulation layer placed on the thin-film specimen, followed by placement of an ITO glass onto the mica layer such that an ITO surface was faced toward the specimen surface. The ITO surface acted as an anode and the specimen side acted as a cathode, while defining a gap of about 40 μm between the cathode surface and the ITO surface of anode, thereby establishing a sample for measurement of electron emission property of the emitter. Measurement method and measurement result thereof will be described in detail in Examples 3 and 4.

EXAMPLE 3

Figure 6:
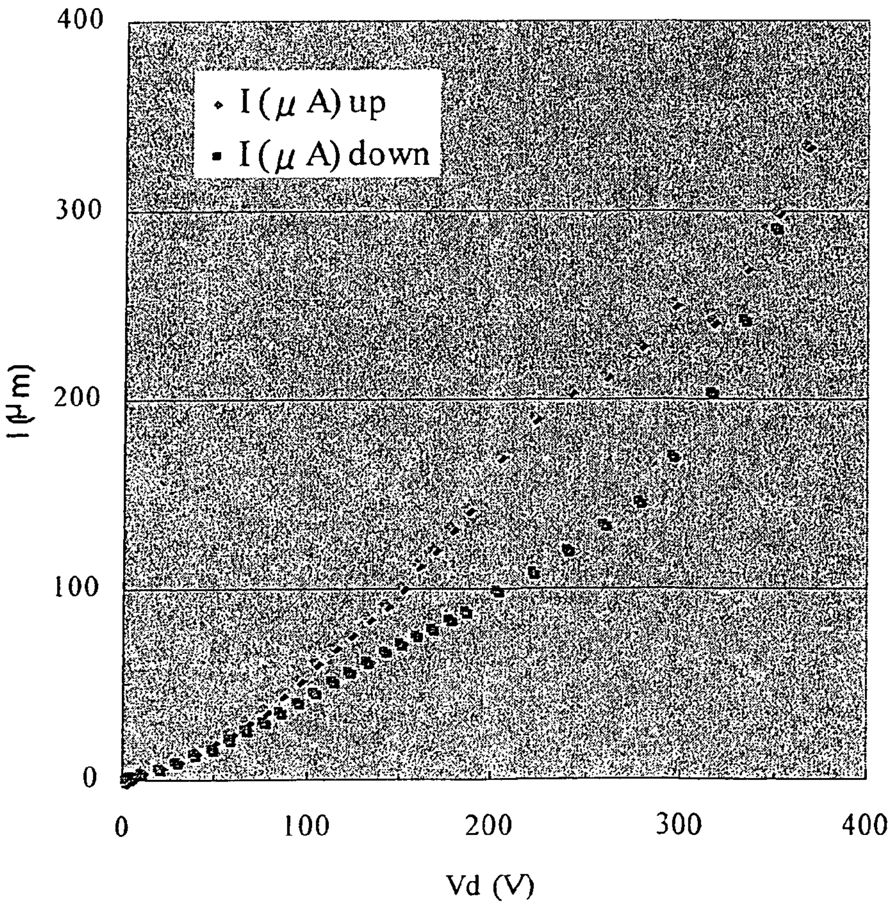
FIG. 6 is a graph of an electron emission property in the atmospheric air containing ethyl alcohol, based on the measurement sample for the fractal emitter fabricated in Example 2.

The fractal emitter measurement sample (see FIG. 5) obtained in Example 2 was installed in a hermetically sealed measurement vessel. At this time, placed in the vessel was a sponge containing ethyl alcohol, thereby realizing an air ambient including a large amount of ethyl alcohol and at the atmospheric pressure. Measurement results of electric current and voltage properties under this condition are shown in FIG. 6. At that time, there was connected a resistance of 100 kΩ in series with the sample, for the purpose of preventing an excessively large electric current from flowing through the sample.

COMPARATIVE EXAMPLE 3

Figure 7:
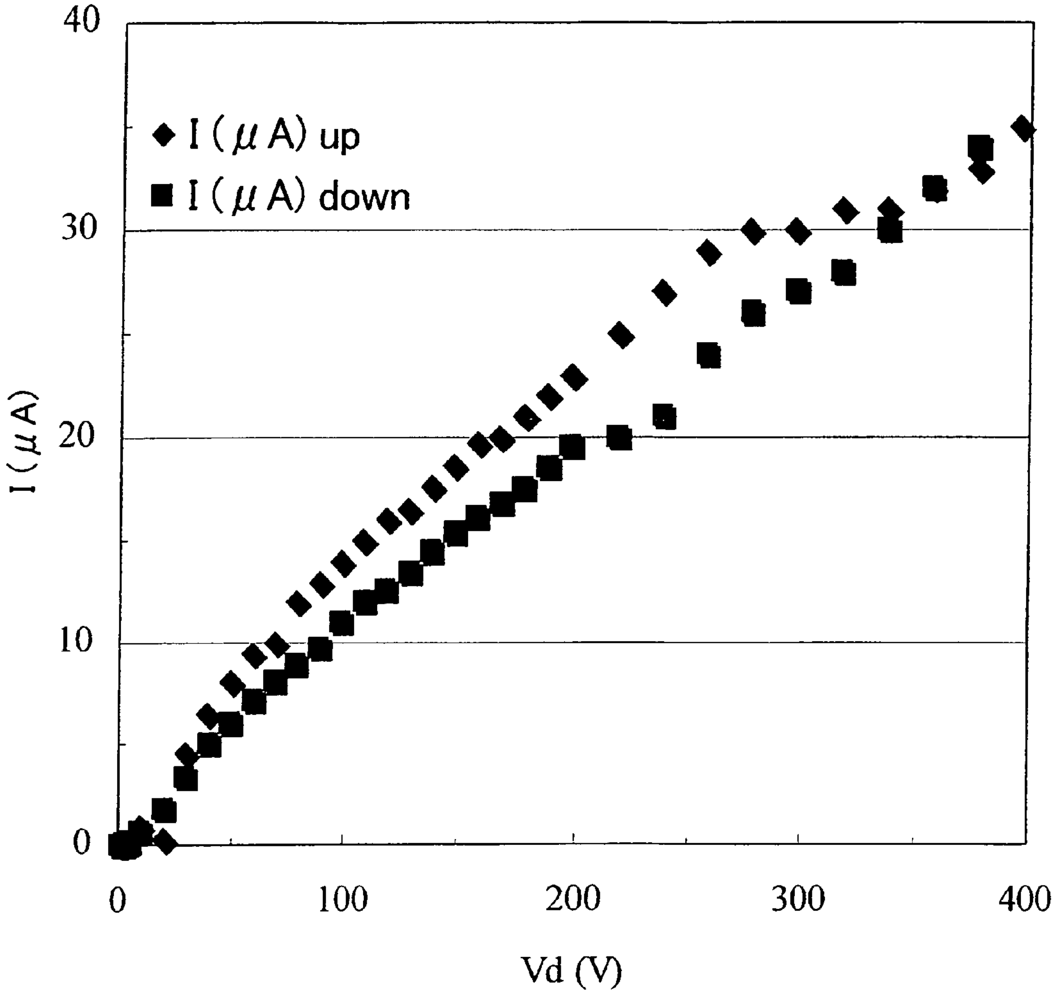
FIG. 7 is a graph of electron emission property in the atmospheric air containing ethyl alcohol, based on the measurement sample for the uniform distribution emitter fabricated in Comparative Example 2.

The same experiment as Example 3 (under the same experiment conditions for ethyl alcohol, resistance, and the like) was conducted for the uniform distribution emitter measurement sample (see FIG. 5) prepared in Comparative Example 2, and the result thereof is shown in FIG. 7.

Comparing FIG. 6 with FIG. 7, the fractal emitter allowed for an electric current about 10 times as large as that of the comparative one, thereby exhibiting a remarkable effect by virtue of the fractal.

EXAMPLE 4

The same experiment as Example 3 was conducted, except for in an atmospheric air at a higher humidity by adopting a sponge containing water instead of one containing ethyl alcohol. At that time, measurements were conducted for the fractal emitter, by using three kinds of resistances of 1 MΩ, 100 kΩ, and 10 kΩ, respectively.

COMPARATIVE EXAMPLE 4

The same experiment as Example 4 (under the same experiment conditions for water, resistances, and the like) was conducted for the uniform distribution emitter.

Figure 8:
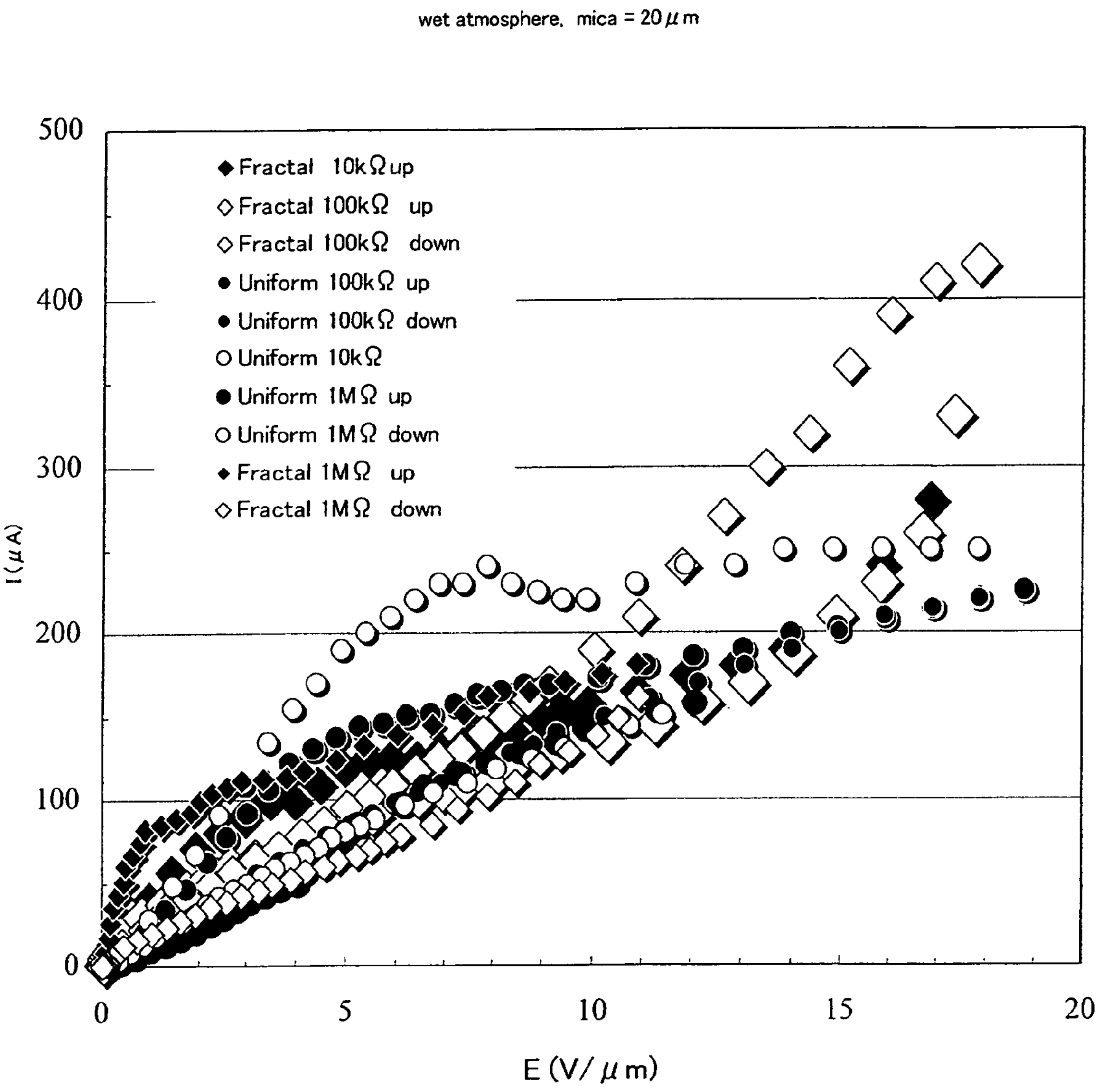
FIG. 8 is a graph of electron emission properties in the atmospheric air at a higher humidity, based on the measurement sample for the fractal emitter and the measurement sample for the uniform distribution emitter.

Measurement results of Example 4 and Comparative Example 4 are shown in FIG. 8. In this case, the fractal emitter exhibits an electric current of about two times that of the uniform distribution emitter, at a higher electric field intensity above 15 V/μm. Further, it can be appreciated that the uniform distribution emitter has a tendency to be saturated in electric current at higher electric field intensities, while the fractal emitter has not such a tendency and rather increase of electric current can be expected for a further increased electric field intensities. In this way, it has been exemplified also in these Example and Comparative Example that the fractal emitter has a desirable performance tendency.

INDUSTRIAL APPLICABILITY

Although significance is given to an in-plane distribution of crystals of an emitter as an element for determining a performance of a cold cathode type electron source, the conventional mainstream was focused on formation of regular patterns. The present invention has succeeded in developing an emitter formed in a self-similar fractal distribution pattern which is not included in conventional patterns, thereby allowing to expect realization of an excellent and unprecedented performance. Application examples of cold cathode type electron sources will be found from now on in fields including a flat panel display, lighting equipment, lithography, electron microscope, electrophotography, planar discharge tube, and in all fields in livelihood. Thus, drastic improvement of performance of cold cathode type electron sources will extensively affect on performance improvement and new product development of electro devices, electronic machines, consumer electronics, and the like, and will allow for expectation of economical propagation effect, so that the emitter of the present invention can be expected to be utilized from now on as an electron source in the above-mentioned various fields as well as the other technical fields.

The invention claimed is:

1. A boron nitride thin-film emitter having an electron emission property, comprising crystals that are each represented by a general formula BN, that each include $sp^3$ bonded boron nitride, $sp^2$ bonded boron nitride, or a mixture thereof, and that each exhibits an acute-ended shape having a field electron emission property, wherein the crystals are aggregated and distributed to exhibit a two-dimensional self-similar fractal pattern.

2. The boron nitride thin-film emitter having an electron emission property of claim 1, wherein the boron nitride thin-film emitter including the crystals aggregated and distributed to exhibit the two-dimensional self-similar fractal pattern, is established in self-forming on an emitter element substrate by a reaction from a vapor phase.

3. The boron nitride thin-film emitter having an electron emission property of claim 2, wherein the boron nitride thin-film emitter including the crystals aggregated and distributed to exhibit the two-dimensional self-similar fractal pattern obtained by the reaction from the vapor phase, is obtained by adjusting the emitter element substrate and a reaction mixture gas flow into a mutually parallel relationship.

4. The boron nitride thin-film emitter of claim 1, wherein the boron nitride thin-film emitter is an emitter to be used in a light emitting display device.

5. The boron nitride thin-film emitter of claim 1, wherein the boron nitride thin-film emitter is an emitter to be used in a lighting device.

6. A production method of a boron nitride thin-film emitter comprising crystals that are each represented by a general formula BN, that each include $sp^3$ bonded boron nitride, $sp^2$ bonded boron nitride, or a mixture thereof, and that each exhibit an acute-ended shape having a field electron emission property, the method comprising the steps of:

preparing an ambient gas including: a dilution gas solely comprising a rare gas such as argon or helium, or hydrogen, or a mixture gas thereof; and 0.0001 to 100 vol % of a source gas of boron source and nitrogen source introduced into the dilution gas;

flowing the ambient gas onto a substrate held at a room temperature to a temperature of 1,300° C., under a pressure of 0.001 to 760 Torr; and irradiating ultraviolet light onto the substrate, with or without generating plasma;

wherein the method further comprises the step of:

adjusting an angle defined between the substrate and the ambient gas flow including the reaction mixture gas to control a distribution pattern and a distribution density of the crystals that are formed at a surface of a film produced on the substrate and that each have the acute-ended shape has said field electron emission property.

7. The production method of a boron nitride thin-film emitter of claim 6, wherein the adjusting step comprises:

adjusting the angle defined between the substrate and the ambient gas flow including the reaction mixture gas so that the substrate and the ambient gas flow are in parallel to form, on the surface of the film produced on the substrate, a two-dimensional self-similar fractal pattern by the crystals each having the acute-ended shape having the field electron emission property, to thereby obtain the boron nitride thin-film emitter having a threshold for electron emission.

8. The production method of a boron nitride thin-film emitter of claim 6, wherein the method further comprises the step of:

controlling the temperature of the substrate and the rate of the ambient gas flow including the reaction mixture gas.

9. An electron emitting method, comprising the step of: applying a voltage to a boron nitride thin-film emitter to cause the boron nitride thin-film emitter to emit electrons, and contacting the boron nitride thin-film emitter with an ambient gas including a polar gas, thereby improving an electron emission property of the boron nitride thin-film emitter wherein the boron nitride thin-film emitter has an electron emission property, and comprises crystals that are each represented by a general formula BN, that each include $sp^3$ bonded boron nitride, $sp^2$ bonded boron nitride, or a mixture thereof, and that each exhibits an acute-ended shape having a field electron emission property, wherein the crystals are aggregated and distributed to exhibit a two-dimensional self-similar fractal pattern.

10. The electron emitting method of claim 9, wherein the polar gas is water and/or alcohol.

11. An electron emitting method, comprising the step of: applying a voltage to a boron nitride thin-film emitter to cause the boron nitride thin-film emitter to emit electrons, and contacting the boron nitride thin-film emitter with an ambient gas including a polar gas, thereby improving an electron emission property of the boron nitride thin-film emitter wherein the boron nitride thin-film emitter has an electron emission property, and comprises crystals that are each represented by a general formula BN, that each include $sp^3$ bonded boron nitride, $sp^2$ bonded boron nitride, or a mixture thereof, and that each exhibits an acute-ended shape having a field electron emission property, wherein the crystals are aggregated and distributed to exhibit a two-dimensional self-similar fractal pattern, and wherein the boron nitride thin-film emitter is an emitter to be used in a light emitting display device.

12. An electron emitting method, comprising the step of: applying a voltage to a boron nitride thin-film emitter to cause the boron nitride thin-film emitter to emit electrons, and contacting the boron nitride thin-film emitter with an ambient gas including a polar gas, thereby improving an electron emission property of the boron nitride thin-film emitter wherein the boron nitride thin-film emitter has an electron emission property, and comprises crystals that are each represented by a general formula BN, that each include $sp^3$ bonded boron nitride, $sp^2$ bonded boron nitride, or a mixture thereof, and that each exhibits an acute-ended shape having a field electron emission property, wherein the crystals are aggregated and distributed to exhibit a two-dimensional self-similar fractal pattern, and wherein the boron nitride thin-film emitter is an emitter to be used in a lighting device.

* * * * *